United States Patent
Zortea (10) Patent No.: US 7,622,987 B1
(45) Date of Patent: Nov. 24, 2009

(54) PATTERN-BASED DC OFFSET CORRECTION

(75) Inventor: Anthony Eugene Zortea, Pipersville, PA (US)

(73) Assignee: PMC-Sierra, Inc., Santa Clara, CA (US)

(*) Notice: Subject to any disclaimer, the term of this patent is extended or adjusted under 35 U.S.C. 154(b) by 27 days.

(21) Appl. No.: 12/019,535

(22) Filed: Jan. 24, 2008

Related U.S. Application Data (60) Provisional application No. 60/886,576, filed on Jan. 25, 2007.

(51) Int. Cl.
*H03F 1/02* (2006.01)
(52) U.S. Cl. .......................... 330/9; 330/279
(58) Field of Classification Search .......... 330/9, 330/279; 327/124, 307
See application file for complete search history.

(56) References Cited

U.S. PATENT DOCUMENTS

| | | | |
|---|---|---|---|
| 4,490,682 A * | 12/1984 | Poulo | ............... 330/9 |
| 4,581,748 A | 4/1986 | Sasaki et al. | |
| 4,633,484 A | 12/1986 | Takeda et al. | |
| 4,862,081 A | 8/1989 | Denison | |
| 5,140,699 A | 8/1992 | Kozak | |
| 5,212,826 A | 5/1993 | Rabe et al. | |
| 5,241,702 A | 8/1993 | Dent | |
| 5,263,194 A | 11/1993 | Ragan | |
| 5,311,554 A | 5/1994 | Morera et al. | |
| 5,715,281 A | 2/1998 | Bly et al. | |
| 5,724,653 A | 3/1998 | Baker et al. | |
| 5,903,825 A | 5/1999 | Goode et al. | |
| 6,006,079 A | 12/1999 | Jaffee et al. | |
| 6,035,004 A | 3/2000 | Nakata | |
| 6,075,409 A | 6/2000 | Khlat | |
| 6,185,260 B1 | 2/2001 | Ishii | |
| 6,218,787 B1 | 4/2001 | Murcko et al. | |
| 6,259,748 B1 | 7/2001 | Yim et al. | |
| 6,335,656 B1 | 1/2002 | Goldfarb et al. | |
| 6,339,711 B1 | 1/2002 | Otaka et al. | |
| 6,370,205 B1 | 4/2002 | Lindoff et al. | |
| 6,442,380 B1 | 8/2002 | Mohindra | |
| 6,449,320 B1 | 9/2002 | Lindoff | |
| 6,535,725 B2 | 3/2003 | Hatcher et al. | |
| 6,560,447 B2 | 5/2003 | Rahman et al. | |
| 6,560,448 B1 | 5/2003 | Baldwin et al. | |
| 6,725,024 B1 | 4/2004 | Lindoff et al. | |
| 6,753,727 B2 * | 6/2004 | Magoon et al. | ............... 330/9 |
| 6,757,340 B1 | 6/2004 | Jakobsson | |
| 6,816,712 B2 | 11/2004 | Otaka et al. | |
| 6,897,700 B1 * | 5/2005 | Fu et al. | ............... 327/307 |
| 6,922,161 B2 | 7/2005 | Lee | |
| 6,937,847 B2 | 8/2005 | Ehrenreich et al. | |
| 6,975,848 B2 | 12/2005 | Rawlins et al. | |
| 6,995,595 B2 | 2/2006 | Kim | |
| 6,999,537 B2 | 2/2006 | Shippee | |
| 7,020,449 B2 | 3/2006 | Shi | |
| 7,024,221 B2 | 4/2006 | Paulus et al. | |
| 7,039,382 B2 | 5/2006 | Shu | |
| 7,046,720 B2 | 5/2006 | Lindoff et al. | |
| 7,132,861 B1 * | 11/2006 | Fu et al. | ............... 327/52 |

* cited by examiner

*Primary Examiner*—Henry K Choe
(74) *Attorney, Agent, or Firm*—Knobbe Martens Olson & Bear LLP (57) ABSTRACT

DC offsets in high-gain amplifiers should be corrected to avoid the signal distortion that would result from amplifier saturation. A predominantly digital technique is described in which a digital algorithm observes patterns in the sign of the amplifier output and drives a digital-to-analog converter (DAC), which reduces the amplifier's offset.

23 Claims, 7 Drawing Sheets

PATTERN-BASED DC OFFSET CORRECTION

CROSS-REFERENCE TO RELATED APPLICATION

This application claims the benefit under 35 U.S.C. § 119 (e) of U.S. Provisional Application No. 60/886,576, filed Jan. 25, 2007, the entirety of which is hereby incorporated by reference.

BACKGROUND

1. Field of the Invention

The invention generally relates to electronics. In particular, the invention relates to handling DC offsets in amplifiers.

2. Description of the Related Art

Figure 1:
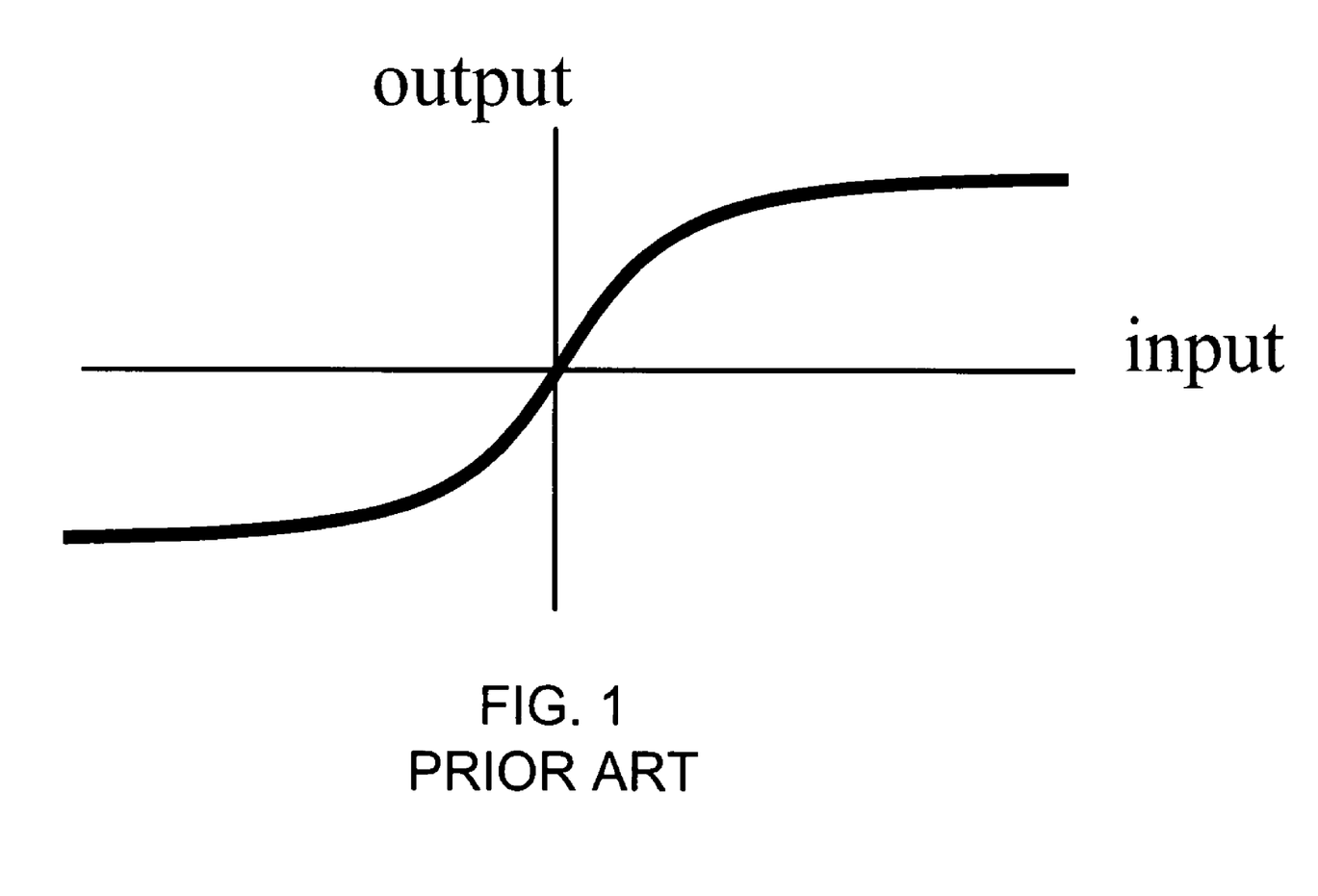
FIG. 1 illustrates saturation in an amplifier.

Typical analog amplifiers have a saturating input-output relationship, as illustrated in FIG. 1. Linear signal processing typically uses operation in the linear part of the curve—at smaller inputs levels. Large input signals, or high-gain can result in output saturation. If the ac portion of the desired input signal is sufficiently small, but the dc portion is relatively large, then with sufficient gain, the output will be saturated.

Figure 2:
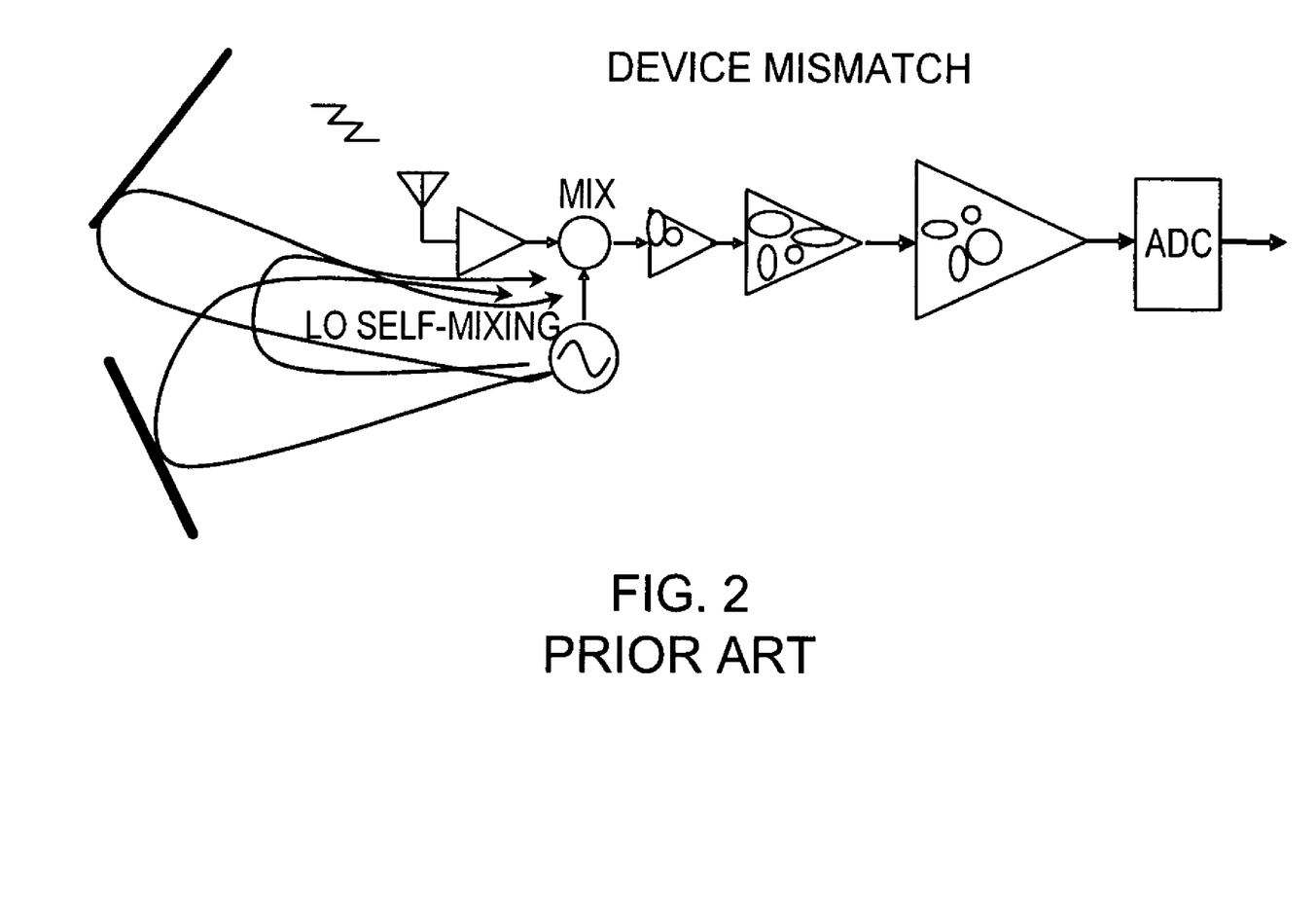
FIG. 2 illustrates examples of sources for DC offsets in a direct conversion radio.

In a direct conversion radio, a schematic of an example of which is illustrated in FIG. 2, there are several sources of these undesirable dc offsets, such as: amplifier input-referred DC offsets due to device mismatch; local oscillator self-mixing; 2nd order distortions; and 1/f transistor noise in amplifiers.

SUMMARY OF THE DISCLOSURE

DC offset correction can be a relatively difficult problem to solve. DC offset correction is one of the most important problems facing the direct conversion radio, and the direct conversion radio is an efficient implementation of a radio.

The invention can include, for example, a system configured to observe patterns in an output signal indicative of the presence of DC offsets. For example, an output of a gain stage can be sliced to +1s and −1s, and the presence of a DC offset can result in relatively long run lengths of either +1s or −1s. The relatively long run lengths are detected and corresponding corrections are made to reduce the run lengths, which typically reduces the DC offsets.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Although particular embodiments are described herein, other embodiments of the invention, including embodiments that do not provide all of the benefits and features set forth herein, will be apparent to those of ordinary skill in the art.

While described in the context of direct conversion radios, the principles and advantages described herein are applicable to any communication channel in which analog amplifiers with undesirable dc offsets may be present. This encompasses a very broad range of circuits inside and outside of data communications.

DC offset correction can be a relatively difficult problem to solve. Correction of DC offsets is desirable in many electronic environments, such as in direct conversion radios. Direct conversion radios and other analog signal processing circuits often use relatively high analog baseband gain. Signals processed by high-gain amplifiers typically do not contain useful content at DC. If spurious DC finds its way onto a signal, then the output of the high-gain amplifier can become saturated, thus distorting the desired part of the signal.

There are many ways for undesired DC offsets to find its way onto the desired signal, such as amplifier DC offset due to device mismatch, local oscillator (LO) self-mixing in the case of direct conversion radios, second order effects of amplifiers, RF mismatch at the antenna port, 1/f transistor noise in amplifiers, and the like. Due to these imperfections, the desired signal at the output of the high-gain amplifiers will typically be distorted unless the DC offsets are corrected to bring the DC offsets to an acceptably low level.

DC offset correction is preferably performed in the "background" or during small duration "idle" times or slots. However, during these idle times or slots, there can often be other adjacent or alternate signals present, and perhaps even an in-band signal from another wireless device. In addition, desired signal content is usually relatively close to DC so as to make the measurement of the undesired DC offset relatively difficult or time consuming with conventional linear analog or linear digital techniques. Furthermore, there can be noise and adjacent channel or alternate channel signals present during the DC correction slot; or during the DC correction slot, the signal may be in a "preamble" or other state where there is content close to DC, making DC offset measurement relatively slow or difficult.

A closed feedback loop can be used to correct DC offset in an amplifier, but this approach would sense the DC offset present at the output of the amplifier. This can be done in an analog fashion with a low-pass filter, but this can create problems since the analog devices used to perform the low pass filter function in analog domain may be prohibitively large to create the relatively low cutoff frequency.

Furthermore, if the undesirable DC offset changes relatively slowly over time, as is typically the case in direct conversion radios, then the offset should be dynamically corrected, and the correction may need to be static during a particular duration of signal reception. Preferably, a DC offset correction circuit operates relatively quickly during some defined time window. It is difficult to make an analog low pass filters that would meet those requirements. Furthermore, analog circuits can introduce uncertainty and other non-idealities.

A problem of efficiently and quickly determining a DC offset can be encountered when a digital technique is used to correct the DC offset. It is preferred for the DC offset to be measured without the use of a high-resolution analog-to-digital converter (ADC), since processing of such signals is costly.

Figure 3:
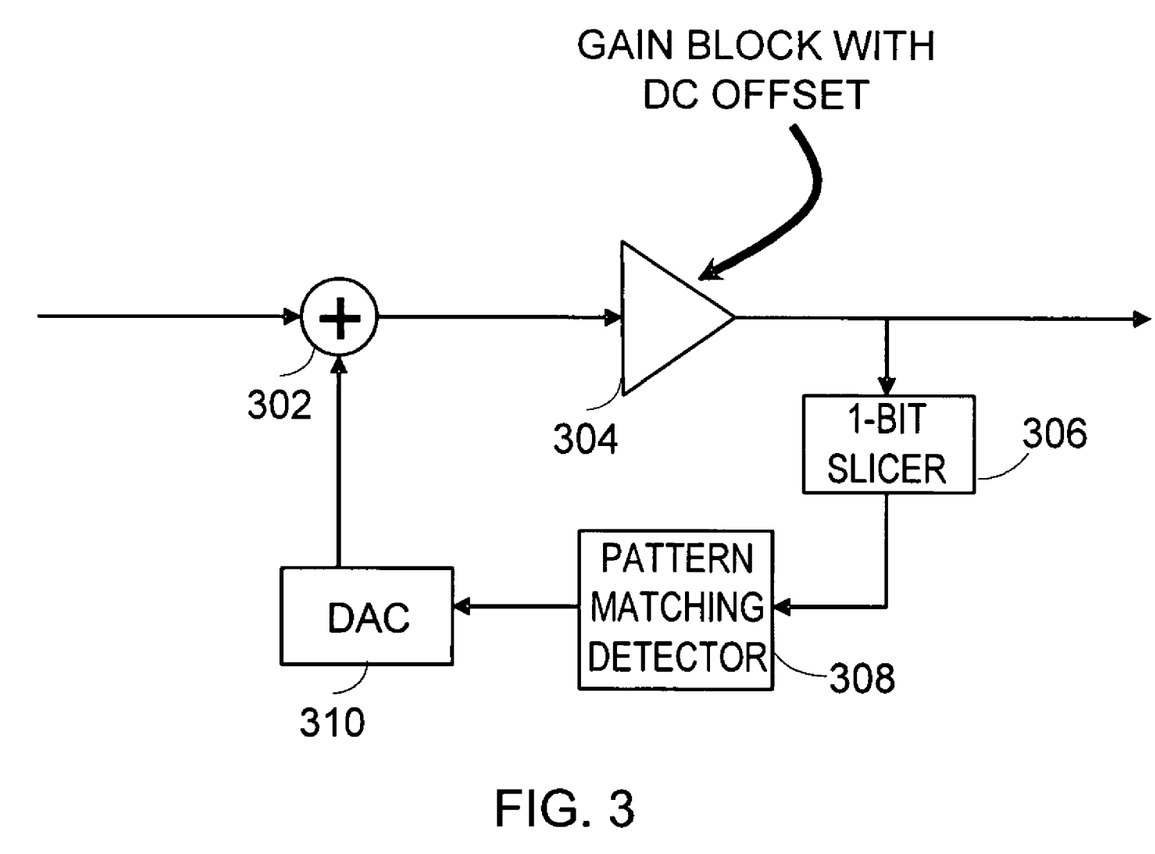
FIG. 3 illustrates an example of an architecture for an amplifier according to one embodiment of the invention.

FIG. 3 illustrates an example of an architecture for an amplifier according to one embodiment of the invention. The illustrated architecture includes a summing circuit 302 for compensation of the DC offset, a gain block 304 that amplifies an input signal to an output signal and possibly generates an undesirable DC offset to be corrected, a 1-bit slicer 306, a pattern matching detector 308, and a digital to analog converter (DAC) 310. In the illustrated embodiment, the summing circuit 302, the 1-bit slicer 306, the pattern matching detector 308, and the DAC 310 form a correction circuit that corrects the DC offsets of the gain block 304.

The gain block 304 is typically implemented by an electronic circuit, such as by an integrated circuit of MOS devices. In one embodiment, the summing circuit 302 and the gain block 304 are integrated as illustrated in FIG. 5. Further details of the amplifier will be described in connection with FIGS. 4 and 5.

The illustrated embodiment of FIG. 3 has the following desirable features: (a) it is mostly digital, so uncertainty is reduced and variability from part to part is advantageously reduced over an analog implementation; (b) it does not require a high-resolution analog-to-digital converter (ADC), so the costly processing of wide-word signals is unnecessary; (c) the DC offset measurement is based on pattern matching, so it can be made to operate quickly in the presence of noise and other undesirable signals; and there is no latency due to the delay through an ADC.

Figure 4:
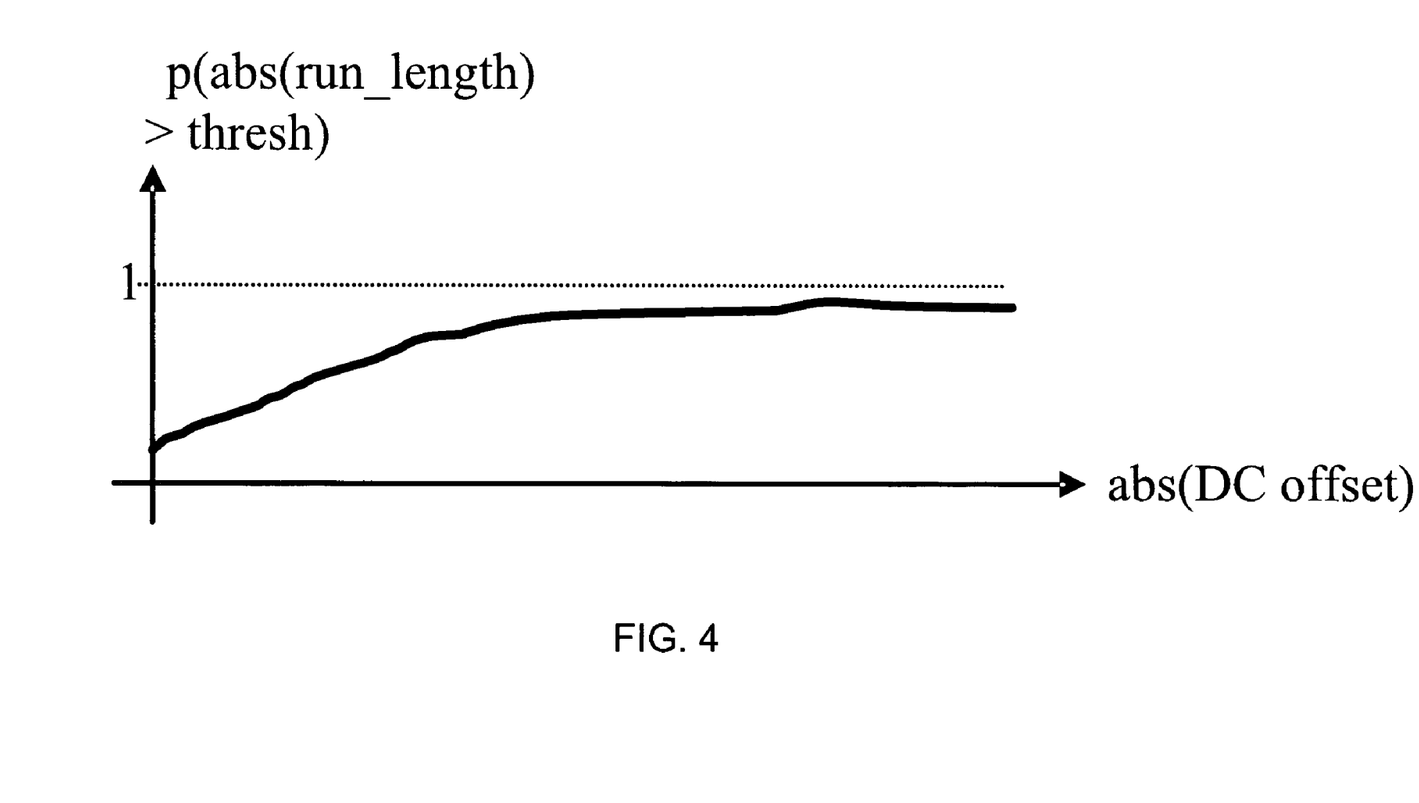
FIG. 4 is a plot illustrating a relationship between run lengths and dc offsets.
Figure 5:
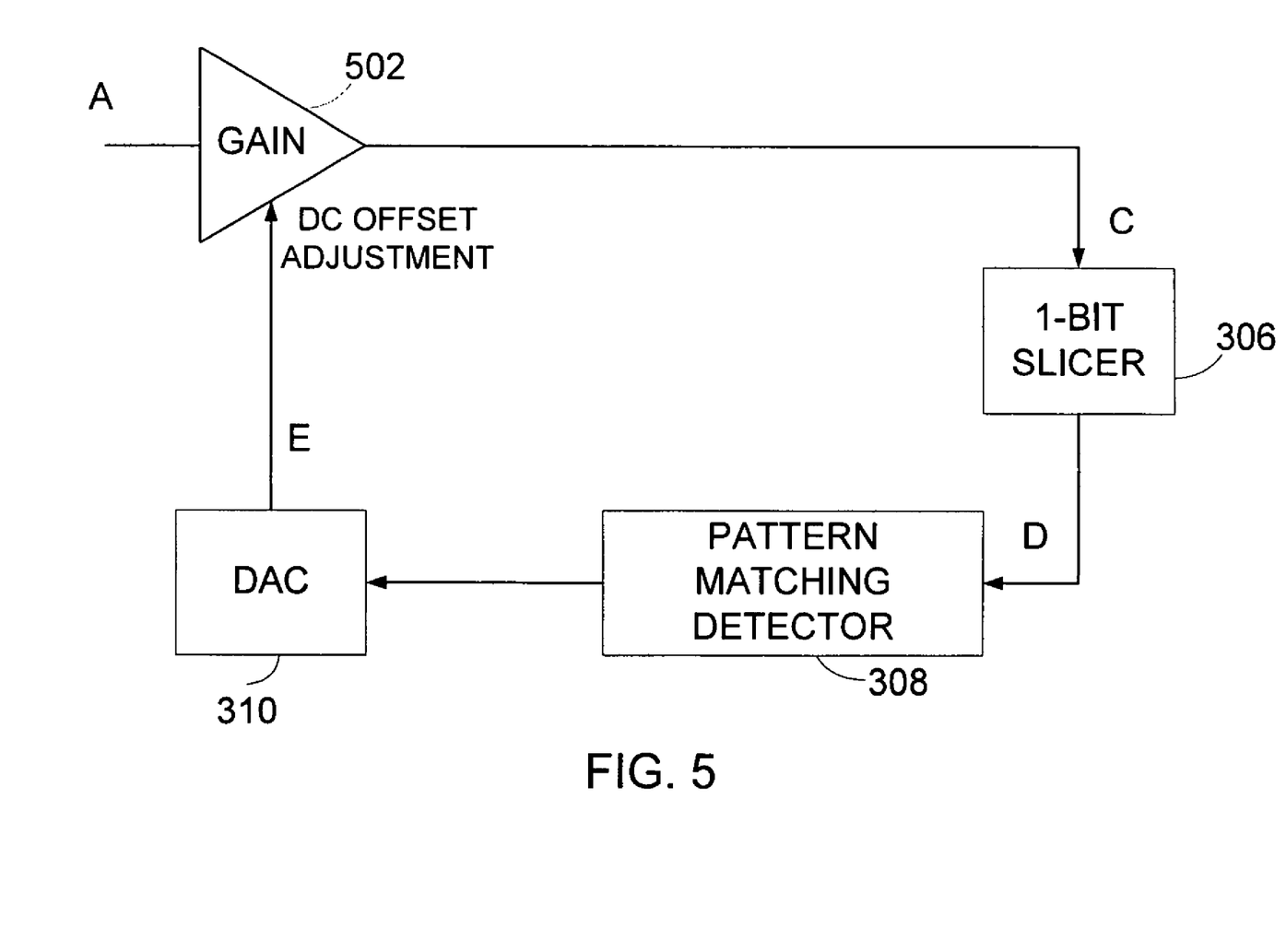
FIG. 5 illustrates an example of a single stage of an amplifier with DC offset correction.

FIG. 4 is a plot illustrating a relationship between run lengths and DC offsets, which illustrates the principles behind the pattern detection. The pattern detection can be embodied in the pattern matching detector 308, which can be implemented by hardware, by firmware/software or by a combination of both hardware and firmware/software. Firmware/software can be stored in a computer-readable medium. For example, a state diagram for detecting patterns and adjusting offset compensation will be described in greater detail later in connection with FIG. 7.

The run lengths of the output of the 1-bit slicer 306 (such as a comparator) are discussed. In telecommunications, slicing typically is typically used in conversion from soft symbols to hard symbols. However, since data bits are not being recovered by the 1-bit slicer 306, the slicer does not have to convert actual symbols and can operate at a clock rate that is unrelated to a symbol rate. However, if the signal has a positive DC offset at the output of the 1-bit slicer 306, the positive run lengths can be expected to exceed some threshold; if the signal has a negative DC offset at the output, the negative run lengths can be expected to exceed a threshold. Positive run lengths are defined as continuous unbroken runs of +1s (states of value +1) from the 1-bit slicer 306. Negative run lengths are defined as continuous unbroken runs of −1s (states of value −1) from the 1-bit slicer 306.

This run length technique has the benefit of converging relatively quickly when the output signal is small since many of the slicer output values will be either positive or negative, depending on the offset.

For the case of white noise, the statistics of run lengths in the presence of DC offsets can be used. This is illustrated in FIG. 4. FIG. 4 is a plot illustrating a relationship between run lengths and DC offsets that can be used to determine that DC offsets exist and to compensate for such DC offsets. An absolute value for DC offset is represented along the horizontal axis, with DC offset increasing to the right. A probability for a run length (either positive or negative) is represented along the vertical axis, with higher probability increasing to the top.

For relatively large offsets, the probability that a run length would exceed some preset threshold is relatively high, causing an adaptive compensation algorithm to converge relatively quickly with respect to large offsets. A tradeoff is that for relatively small dc offsets, the probability that the adaptive compensation algorithm converges to 0 offset begins to decrease because the probably of an excessive run length diminishes; however, there are additional correction mechanisms that can be introduced to account for this.

In this manner, the adaptive compensation algorithm is able to function on a IEEE 802.16d/e preamble, or during a transmit-receive (TXRX) gap when there is no receive signal, but noise and the presence of adjacent or alternate interferers can be expected, as well as in-band interferers from other subscribers.

FIG. 5 illustrates an example of a single stage of an amplifier with DC offset correction. A gain block 502 includes an input for DC offset adjustment. In one embodiment, the gain block 502 includes the summing circuit 302 and the gain block 304 described earlier in connection with FIG. 3. However, other circuit topologies can be used to adjust DC offsets.

Figure 6:
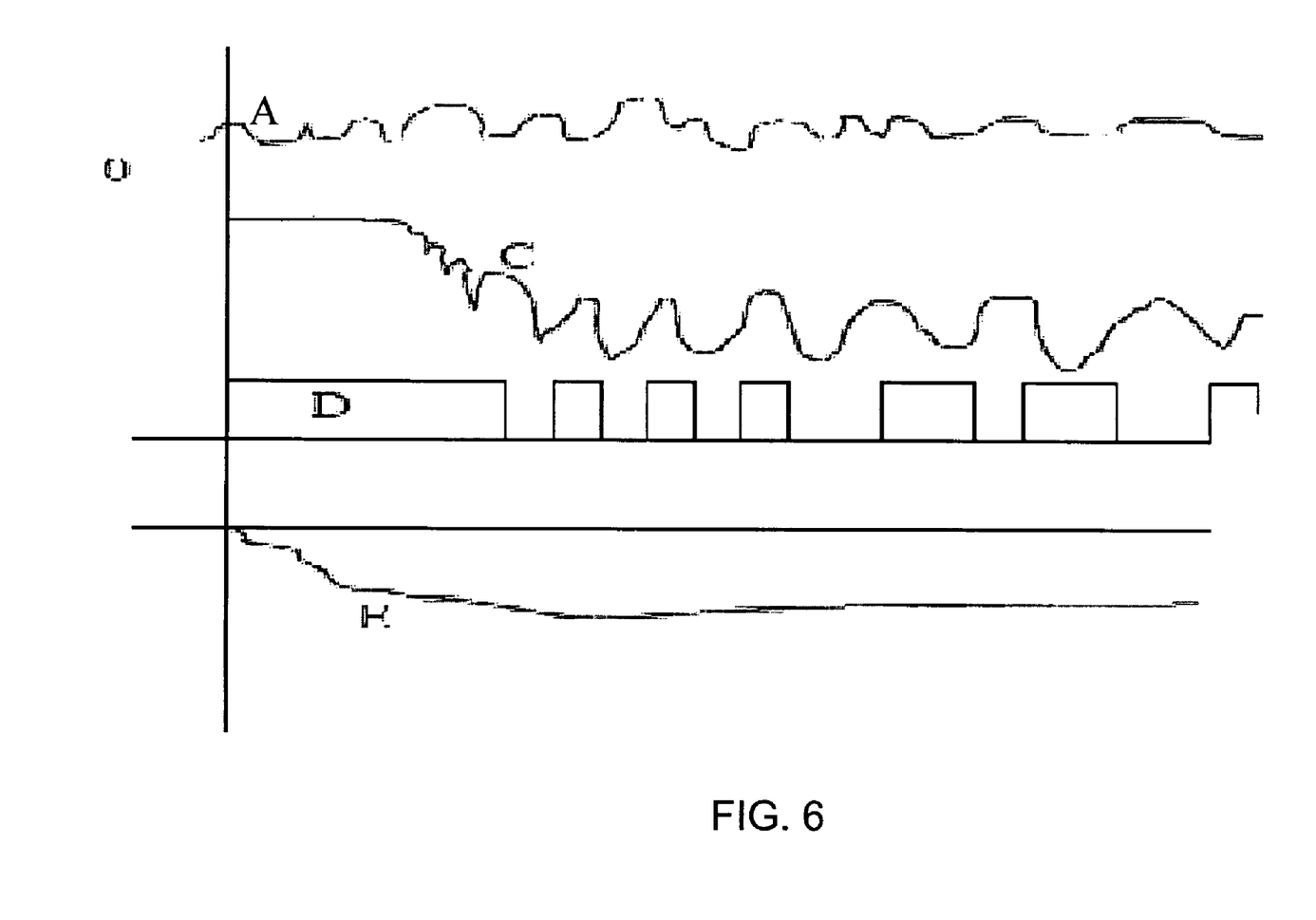
FIG. 6 includes prophetic examples of waveforms for the amplifier depicted in FIG. 5.

FIG. 6 includes prophetic examples of corresponding waveforms for the amplifier illustrated in FIG. 5. Time is represented along the horizontal axis and increases to the right. Various waveforms are represented along the vertical axis. Labels A, C, D, E on signal lines in FIG. 5 are represented by similarly labeled waveforms in FIG. 6. Signal A and waveform A represent the input signal. Signal C and waveform C represent an output of the gain block 502. Signal D and waveform D represent an output (sliced signal) of the 1-bit slicer 306 (clock reference for the 1-bit slicer 306 is not shown). In one embodiment, the pattern matching detector 308 controls the output of the DAC 310, such as, for example, by incrementing, decrementing, or maintaining a previous value that is provided as an input to the DAC 310. The DAC 310 can also be configured to be incremented or decremented. In the illustrated embodiment, the output of the DAC 310 provides an analog voltage for the compensation of DC offset voltages. It will be understood that an output of current instead of voltage can also be provided from the DAC 310. The DC offset adjustment signal from the DAC 310 is labeled as signal E and waveform E.

Initially, the input signal A has a DC offset that results in a relatively large DC offset that is represented in the waveform C. As a result of the relatively large DC offset, the run lengths are relatively long as expressed in waveform D. The relatively long run lengths are detected by the pattern matching detector 308, by, for example, comparing the determined run lengths versus some threshold. Appropriate threshold values will be readily determined by one of ordinary skill in the art. It will be understood that the threshold values will typically vary based on the symbol rate of the 1-bit slicer 306. As a result of detection of run lengths exceeding the threshold values, the pattern matching detector 308 provides a control, such as a digital count, for the DAC 310. In the illustrated example, in response to the run length determinations, the output E of the DAC 310 goes negative over time as illustrated by waveform C to correct or trim the DC offset, and output C of the gain block 502 has decreased DC offset as illustrated by the waveform C.

Many amplifiers have more than one gain (amplifier) stage such as a series of gain stages arranged in a cascade. One or more gain stages can have their DC offsets adjusted. In one embodiment, each of the gain stages of a series of gain stages is individually adjusted for DC offset correction. The state diagram of FIG. 7 can be used for a gain stage of a cascade of gain stages such that the DC offset correction for the gain stage can be coordinated with the DC offset corrections of other gain stages of the cascade of gain stages.

Figure 7:
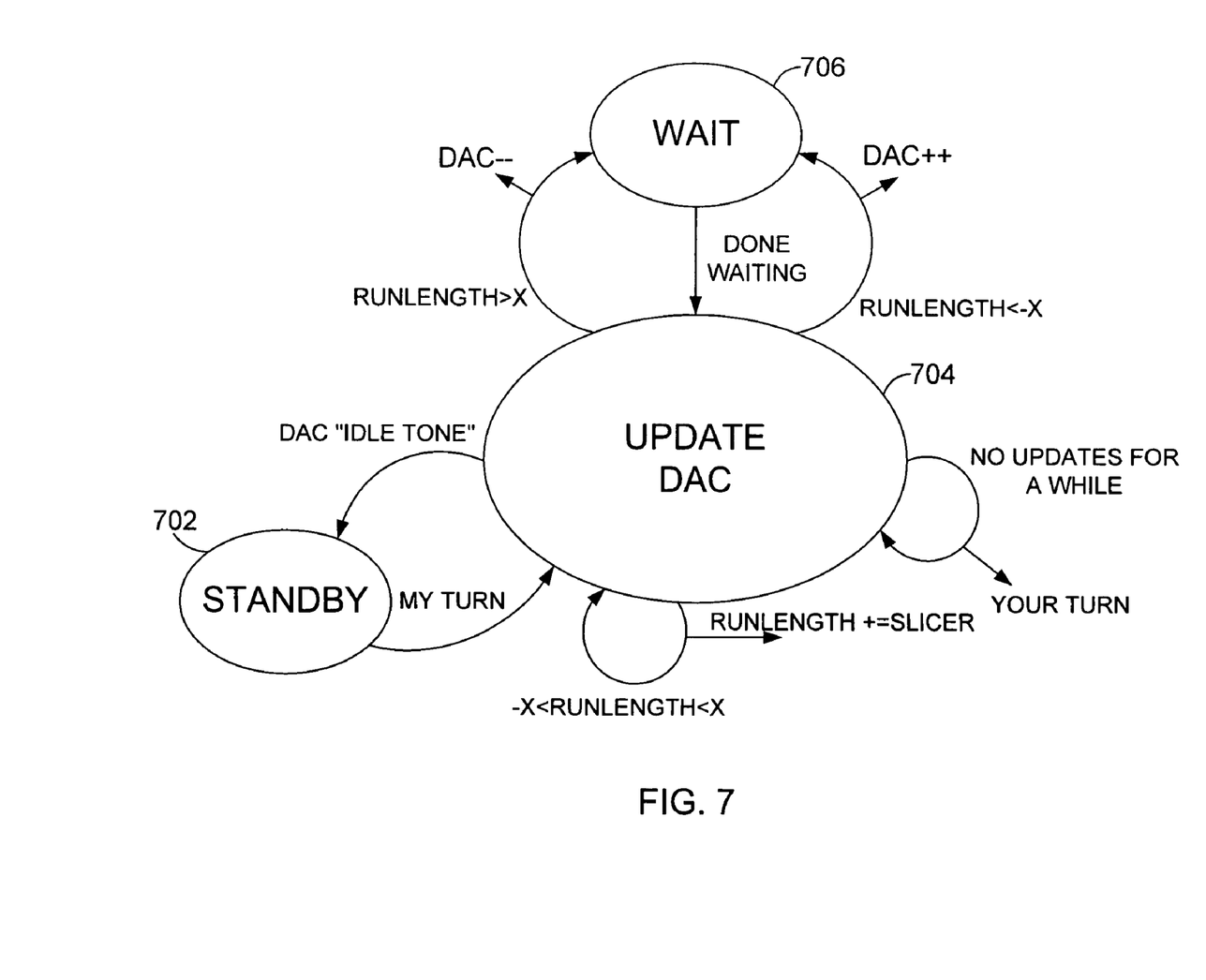
FIG. 7 illustrates an example of a state machine representing a control algorithm that can be used, for example, in a gain stage of a plurality of gain stages.

The gain stages can correspond to variable gain amplifiers (VGAs). For example, two or more VGAs can be cascaded together, that is, arranged in series, for increased gain. It should be noted, however, that some of the gain stages can be non-variable gain. The illustrated architecture includes control signals labeled "my turn" and "your turn" which facilitate control. The signal "my turn" is an input signal for initiating the execution of the offset correction. The signal "your turn," is an output signal that is asserted when the offset correction has been executed. For example, a controller (not shown) can assert the "my turn" to a first VGA, wait for the first VGA to complete the offset correction, determine that offset correction is complete by monitoring the "your turn" signal, and then assert the "my turn" signal to the next VGA in the cascade of VGAs. In one embodiment, the DC offset correction is also sequenced in the order of the signal flow, such as, for example, generally in the direction from input to output.

The state diagram of FIG. 7 includes a standby state 702, an update DAC state 704, and a wait state 706. The state diagram can describe the operation of a process or a state machine and can be used for control of an individual gain stage in a cascade of gain stages. While the state diagram of FIG. 7 will be described in the context of a state machine, it will be understood that portions of the state machine can be embodied in hardware, in firmware or software, or by a combination of both hardware and/or firmware/software. In addition, the illustrated state diagram can be modified in a variety of ways. For example, in another embodiment, various portions of the illustrated state diagram can be combined, can be divided, can be rearranged in an alternate sequence, can be removed, or the like.

The state machine begins in the standby state 702. A controller or another stage in the cascade, such as the prior gain stage, asserts or activates the "my turn" control, and the state diagram transitions from the standby state 702 to the update DAC state 704. In the update DAC state 704, the state machine monitors the run lengths and is responsive to patterns. For example, the state machine can monitor the output of the 1-bit slicer 306 (FIGS. 3 and 5) to observe for patterns of run lengths of +1s or −1s. In the illustrated state machine, the run lengths of +1s are counted as positive values, and the run lengths of −1s are counted as negative values. The counts for run length are represented in the state diagram with the variable "runlength." It will be understood that separate counts can alternatively be maintained for the +1 and the −1 run length counts.

The counts are updated as indicated by "runlength+=slicer." If the value for the count after the update stays within the thresholds of −X and +X, the state machine returns to the update DAC state 704. While illustrated with symmetrical thresholds of −X and +X, it will be understood that asymmetrical thresholds can also be used.

If the count ("runlength") exceeds the threshold (X) for the positive offset, the DC offset is decreased (more negative) by, for example, lowering the output voltage of the DAC 310 as indicated by "DAC−−." The state machine then proceeds to the wait state 706, which permits the correction with time to become effective, before returning to the update DAC 704 state 704. An appropriate time for the wait state 706 will be readily determined by one of ordinary skill in the art and will depend on factors such as slew rates and the like. If the count (negative "runlength") is below the threshold (−X) for the negative offset (exceeds the threshold in absolute value), then the DC offset is increased (more positive), by, for example, raising the output voltage of the DAC 310 as indicated by "DAC++."

If there are "no updates for a while," for example, if there have been no adjustments to the DAC setting for greater than some time period, such as a predetermined time period, then the offset correction is complete until reinitiated, and the state machine can indicate to a controller that the DC offset correction is complete or can indicate to a subsequent gain stage that the subsequent gain stage can initiate its offset correction. In one embodiment, the "your turn" control output of one gain stage is provided as the "my turn" control input of a subsequent gain stage. After asserting the "your turn" control, the state machine can return to the update DAC state 704. In another embodiment (not shown), after asserting the "your turn" control, the state machine returns to the standby state 702.

Practical DACs have range and resolution limits. One embodiment examines the output or input for the DAC(s) and watches for an "idle tone," that is, a sequence of DAC increments and decrements which indicate that the DAC resolution limit has been reached and no further offset corrections can be made. When such an idle tone is detected, the state machine can pass control to the next VGA DC offset correction subsystem.

A pseudo-code description of an algorithm represented by the state diagram of FIG. 7 is presented in the following. The following pseudo-code illustrates how to compute the run lengths, and the integrated run length, or run length balance (note that the pseudo-code examines the current (time) output of the slicer ("slicer" variable), and the output of the slicer from the previous time ("last slicer" variable)):

case ({slicer,lastSlicer})
   00: runLength−−;
   11: runLength++;
   01: begin
   runLength=−1;
   rlBalance+=runLength;
   end;
   10: begin
   runLength=+1;
   rlBalance+=runLength;
   end;

end case

With the run lengths "runLength", and the integrated run lengths "rlBalance", the DC offset DACs can be controlled as shown in the following pseudo-code:
   if (runLength>maxRunLength) then dac−−
   else if (runLength<−maxRunLength) then dac++
   else if (rlBalance>maxRLBalance) then dac−−
   else if (rlBalance<−maxRLBalance) then dac++
   else do nothing

OTHER EMBODIMENTS

Patterns other than run lengths exceeding a simple threshold are possible. For example, the threshold can be varied as a function of time, or as a function of previous run length values. Furthermore, the run lengths themselves can be filtered or averaged to estimate the DC offset, which can improve accuracy.

One embodiment uses a threshold that can vary over time. For example, the threshold can be increased with time so that "false positive" DAC updates are avoided.

One embodiment examines patterns of the run lengths themselves, such as an average value of run lengths ("rlBalance" in the pseudo-code) in a given run length sequence.

One embodiment simultaneously examines the instantaneous run lengths and the integrated run lengths (as illustrated in the pseudo-code).

One embodiment examines patterns of the run lengths themselves, looks for a preponderance of positive or negative run lengths, and adjusts the DACs accordingly. For example, if 8 of the last 10 run lengths have been positive, then the DAC should be decremented, even if the value of the run lengths have not exceeded the simple run length threshold.

One embodiment includes control of a low gain mode for the variable gain amplifiers (VGAs) during adapt time in which the VGAs are set to a relatively low, such as minimum gain, which can reduce the impact of high transition density at the comparator input due to noise or other interferers.

One embodiment examines the elapsed time since a DAC updates update and passes control to the next VGA/DC offset correction block if the time exceeds a certain value.

One embodiment examines the output of the DACs and watching for an "idle" tone, that is, a sequence of DAC increments and decrements which indicate that the DAC resolution limit has been reached and no further offset corrections can be made. When such an idle tone is detected, the algorithm can pass control to the next VGA DC offset correction sub-system.

In addition, patterns of run lengths can be observed, since some run lengths can be broken by small numbers of slicer output values in the opposite direction, even if the DC offset is relatively large. For example, if a simple threshold were, for example, 10 counts, then a run length sequence such as {9, −1, 9, −1, 8, '1} would not trigger a DC offset correction digital-to-analog converter (DAC) change, even though there are a preponderance of positive run lengths. The threshold can be fixed and/or predetermined. However, the excess of positive slicer output values can be readily observed. For example, this can be implemented by integrating the run lengths and comparing the integrated result to a threshold, and updating the DAC when the signal crosses the threshold.

In one embodiment, integration is performed by a pure integrator. The positive and negative values being integrated typically prevent the integrator from overflowing; however, a maximum value, such as a saturation value, can be used to limit the integrated value. In another embodiment, a digital filter with a low-pass characteristic is used. One example of such a filter is a moving average. In another example, an exponentially-weighted moving average is used. In another embodiment, a voting technique is used (such as 8 of the last 10).

Various embodiments have been described above. Although described with reference to these specific embodiments, the descriptions are intended to be illustrative and are not intended to be limiting. Various modifications and applications may occur to those skilled in the art.

What is claimed is:

1. A method for correcting one or more DC offsets in an amplifier, the method comprising:
   slicing an output signal of a gain stage of the amplifier to generate a 1-bit sliced signal, wherein symbols of the 1-bit sliced signal comprises a first state or a second state, wherein slicing is performed by electronic hardware;
   determining the presence of one or more patterns associated with DC offsets from the output signal of the gain stage of the amplifier by analyzing the 1-bit sliced signal for run length, wherein a run length comprises a count of consecutive runs of the first state or the second state, wherein a run length of at least a threshold value for the first state or the second state is associated with a positive DC offset or a negative DC offset, respectively; and
   generating a correction to reduce the DC offset based at least partly on a count of the run length of the first state or the second state.

2. The method of claim 1, wherein generating the correction comprises adjusting an output voltage of a digital to analog converter (DAC) based at least partly on one or more observed run length patterns.

3. The method of claim 1, wherein analyzing further comprises comparing the run length to one or more fixed thresholds.

4. A method for correcting one or more DC offsets in an amplifier, the method comprising:
   determining the presence of one or more patterns associated with DC offsets from an output of a gain stage of the amplifier, wherein determining the presence of one or more patterns comprises:
      slicing an output signal of the gain stage to generate a sliced signal; and
      analyzing the sliced signal for run length, wherein analyzing further comprises comparing the run length to one or more thresholds, and varying the one or more thresholds to reduce false positive corrections;
   generating a correction to reduce the DC offset based at least partly on the determination.

5. A method for correcting one or more DC offsets in an amplifier, the method comprising:
   determining the presence of one or more patterns associated with DC offsets from an output of a gain stage of the amplifier, wherein determining the presence of one or more patterns comprises:
      slicing an output signal of the gain stage to generate a sliced signal; and
      analyzing the sliced signal for run length, wherein analyzing further comprises calculating average values of run lengths for comparison to one or more thresholds;
   generating a correction to reduce the DC offset based at least partly on the determination.

6. A method for correcting one or more DC offsets in an amplifier, the method comprising:
   determining the presence of one or more patterns associated with DC offsets from an output of a gain stage of the amplifier, wherein determining the presence of one or more patterns comprises:
      slicing an output signal of the gain stage to generate a sliced signal; and
      analyzing the sliced signal for run length, wherein analyzing further comprises calculating integrated values of run lengths and using both integrated values and instantaneous run length values for comparison to one or more thresholds;
   generating a correction to reduce the DC offset based at least partly on the determination.

7. A method for correcting one or more DC offsets in an amplifier, the method comprising:
   determining the presence of one or more patterns associated with DC offsets from an output of a gain stage of the amplifier, wherein determining the presence of one or more patterns comprises:
      slicing an output signal of the gain stage to generate a sliced signal;
      analyzing the sliced signal for run length; and analyzing a plurality of run lengths to generate a vote, and using the vote for comparison to one or more thresholds;

generating a correction to reduce the DC offset based at least partly on the determination.

8. The method of claim 1, wherein the amplifier further comprises at least one variable gain amplifier, the method further comprising reducing a gain of the at least one variable gain amplifier at least during a time for determining the presence of the one or more patterns.

9. A method for correcting one or more DC offsets in an amplifier, the method comprising:
   determining the presence of one or more patterns associated with DC offsets from an output of a gain stage of the amplifier;
   generating a correction to reduce the DC offset based at least partly on the determination; and
   determining that a DC offset correction process is complete based at least partly on an elapsed time occurring from a previous correction, and passing control to a subsequent gain stage in the amplifier.

10. The method of claim 1, further comprising determining that a digital-to-analog converter (DAC) resolution limit has been reached, and passing control to a subsequent gain stage in the amplifier.

11. An apparatus comprising:
   a gain stage having an output;
   a slicer configured to slice the output signal of the gain stage to generate a 1-bit sliced signal, wherein symbols of the 1-bit sliced signal comprises a first state or a second state;
   a pattern matching detector configured to analyze the sliced signal for run length, wherein a run length comprises a count of consecutive runs of the first state or the second state, wherein a run length of at least a threshold for the first state or the second state is associated with a positive DC offset or a negative DC offset, respectively; and
   a correction circuit configured to determine the presence of one or more patterns associated with DC offsets from an output of the gain stage, and to generate a correction to reduce a DC offset based at least partly on a count of the run length of the first state or the second state.

12. The apparatus of claim 11, wherein the correction circuit further comprises a digital to analog converter (DAC), wherein the pattern matching detector is configured to adjust an output voltage of a digital to analog converter (DAC) based at least partly on one or more observed run length patterns.

13. The apparatus of claim 11, wherein the pattern matching detector is configured to compare the run length to one or more fixed thresholds to determine whether to make a correction.

14. An apparatus comprising:
   a gain stage having an output; and
   a correction circuit configured to determine the presence of one or more patterns associated with DC offsets from an output of the gain stage, and to generate a correction to reduce a DC offset based at least partly on the determination, wherein the correction circuit comprises:
      a 1-bit slicer configured to generate a sliced signal from the output signal of the gain stage; and
      a pattern matching detector to analyze the sliced signal for run length, wherein the pattern matching detector is configured to compare the run length to one or more thresholds, and is further configured to vary the one or more thresholds to reduce false positive corrections.

15. An apparatus comprising:
   a gain stage having an output; and
   a correction circuit configured to determine the presence of one or more patterns associated with DC offsets from an output of the gain stage, and to generate a correction to reduce a DC offset based at least partly on the determination, wherein the correction circuit comprises:
      a 1-bit slicer configured to generate a sliced signal from the output signal of the gain stage; and
      a pattern matching detector to analyze the sliced signal for run length, wherein the pattern matching detector is configured to calculate average values of run lengths for comparison to one or more thresholds to determine whether to make a correction.

16. An apparatus comprising:
   a gain stage having an output; and
   a correction circuit configured to determine the presence of one or more patterns associated with DC offsets from an output of the gain stage, and to generate a correction to reduce a DC offset based at least partly on the determination, wherein the correction circuit comprises:
      a 1-bit slicer configured to generate a sliced signal from the output signal of the gain stage; and
      a pattern matching detector to analyze the sliced signal for run length, wherein the pattern matching detector is configured to integrate values of run lengths and to compare both integrated values and instantaneous run length values to one or more thresholds to determine whether to make correction.

17. An apparatus comprising:
   a gain stage having an output; and
   a correction circuit configured to determine the presence of one or more patterns associated with DC offsets from an output of the gain stage, and to generate a correction to reduce a DC offset based at least partly on the determination, wherein the correction circuit comprises:
      a 1-bit slicer configured to generate a sliced signal from the output signal of the gain stage; and
      a pattern matching detector to analyze the sliced signal for run length, wherein the pattern matching detector is configured to analyze a plurality of run lengths to generate a vote, and to compare the vote to one or more thresholds to determine whether to make a correction.

18. The apparatus of claim 11, wherein the gain stage has variable gain, wherein the correction circuit is further configured to reduce a gain of the variable-gain gain stage when the correction circuit is active.

19. An apparatus comprising:
   a gain stage having an output; and
   a correction circuit configured to determine the presence of one or more patterns associated with DC offsets from an output of the gain stage, and to generate a correction to reduce a DC offset based at least partly on the determination, wherein the correction circuit is further configured to determine that a DC offset correction process is complete based at least partly on an elapsed time occurring from a previous correction, and is configured to pass control to a subsequent gain stage of the apparatus in response to the determination of elapsed time.

20. The apparatus of claim 11, wherein the correction circuit further comprises a digital-to-analog converter (DAC), wherein the correction circuit is configured to determine that a resolution limit of the DAC has been reached, and is further configured to pass control to a subsequent gain stage of the apparatus.

21. The apparatus of claim 11, wherein the apparatus further comprises a direct conversion receiver.

22. An apparatus for correcting one or more DC offsets in an amplifier, the apparatus comprising:
- means for slicing an output signal of a gain stage of the amplifier to generate a 1-bit sliced signal, wherein symbols of the 1-bit sliced signal comprise a first state or a second state, wherein slicing is performed by electronic hardware;
- means for determining the presence of one or more patterns associated with DC offsets from the output of a gain stage of the amplifier, wherein the determining means analyzes the 1-bit sliced signal for run length, wherein a run length comprises a count of consecutive runs of the first state or the second state, wherein a run length of at least a threshold value for the first state or the second state is associated with a positive DC offset or a negative DC offset, respectively; and
- means for providing an adjustment to correct the DC offset based at least partly on a count of the run length of the first state or the second state.

23. A computer readable medium which stores a computer program that embodies a method of correcting one or more DC offsets in an amplifier, the method comprising:
- receiving run length information generated from counting symbols of consecutive runs of a first state or a second state of a 1-bit sliced signal, wherein the output signal of a gain stage of the amplifier is sliced to generate the 1-bit sliced signal, wherein a run length of at least a threshold value for the first state or the second state is associated with a positive DC offset or a negative DC offset, respectively;
- determining the presence of one or more patterns associated with DC offsets from an output of a gain stage of the amplifier by analyzing run lengths of the 1-bit sliced signal; and
- generating a correction to reduce the DC offset based at least partly on a count of the run length of the first state or the second state.

* * * * *